United States Patent [19]

Footh

[11] 4,096,560
[45] Jun. 20, 1978

[54] PROTECTION CIRCUIT TO MINIMIZE THE EFFECTS OF POWER LINE INTERRUPTIONS ON THE CONTENTS OF A VOLATILE ELECTRONIC MEMORY

[75] Inventor: John W. Footh, Orange, Calif.

[73] Assignee: Rockwell International Corporation, El Segundo, Calif.

[21] Appl. No.: 846,480

[22] Filed: Oct. 28, 1977

[51] Int. Cl.² .................... G06F 1/00; G11C 13/00
[52] U.S. Cl. ..................................... 364/200; 365/228
[58] Field of Search ............... 364/200 MS, 900 MS; 361/90; 365/226–228

[56] References Cited

U.S. PATENT DOCUMENTS

| 3,512,044 | 5/1970 | Jones | 361/90 |
|---|---|---|---|
| 3,566,359 | 2/1971 | Connelly | 364/900 |
| 3,624,617 | 11/1971 | Putterman et al. | 364/200 |
| 3,810,110 | 5/1974 | Kotok et al. | 364/200 |
| 3,860,855 | 1/1975 | Caswell | 361/90 |
| 3,937,937 | 2/1976 | McVey | 364/200 |
| 3,959,778 | 5/1976 | Brette | 364/200 |
| 3,980,935 | 9/1976 | Worst | 365/228 |

Primary Examiner—Harvey E. Springborn
Attorney, Agent, or Firm—H. Fredrick Hamann; G. Donald Weber, Jr.; Morland C. Fischer

[57] ABSTRACT

A protection circuit to provide suitable disabling control signals to a microprocessor and to an electronic memory to prevent the loss of stored data from the memory during periods of power line interruption or unacceptable power deviations.

7 Claims, 2 Drawing Figures

PROTECTION CIRCUIT TO MINIMIZE THE EFFECTS OF POWER LINE INTERRUPTIONS ON THE CONTENTS OF A VOLATILE ELECTRONIC MEMORY

BACKGROUND OF THE INVENTION

1. Field of the Invention

This invention relates to a unique protection circuit for preventing a loss or change in the contents of an electronic memory system (e.g. a microprocessor controlled electronic pin ball game), as a result of undesirable line transients or power interruptions.

2. Prior Art

As is known to those skilled in the art, during the existence of power line interruptions or transient conditions, there may be a high occurrence of data loss or undesirable modification of stored data in an electronic memory circuit. One such electronic memory circuit which is adversely effected by power line interruptions is that utilized in a system, such as, for example, a micropressor controlled electronic pin ball game, wherein accounting data relating to bookkeeping and other credit information is stored and maintained. Power line interruptions may occur as a result of a power cut off, loading down the power supply with other utilization devices that consume large amounts of power, toggeling the power line, etc.

A conventional technique for protecting a low power semiconductor memory circuit from a loss of stored contents is a simple auxiliary battery backup arrangement that is integrated with the memory to maintain memory data integrity during power interruption. However, a major problem in this prior art scheme occurs during the transition from the line power supply to the auxiliary battery back up supply. During this transition period, the system d.c. power supply is in an out of tolerance condition (i.e. a condition wherein the available voltage deviates from the acceptable operating voltage level) which in turn causes a loss of control within the system microprocessor. As a result of this loss of control or uncertainty state, the microprocessor randomly produces control signals to undesirably write or to change the contents of the semiconductive memory. A loss or change of data stored in the semiconductive memory could result in loss of financial records and the corresponding profits relating thereto to the pin ball game operator.

SUMMARY OF THE INVENTION

Briefly, and in general terms, a protection circuit is disclosed to prevent the loss or change of the contents of an electronic memory used in a system, such as an electronic microprocessor controlled pin ball game, as a result of undesirable line transient or power interruptions. The circuit includes a voltage threshold level detector to sample input voltage signals from a power supply. An output terminal of the level detector is connected to respective input terminals of a pair of one-shot multivibrators. A first multivibrator is responsive to power coming up conditions, and the second multivibrator is responsive to power going down conditions. Therefore, should any out of tolerance condition be sensed during an interval of input power transition, the pair of multivibrators are triggered by output signals from the level detector. In such an out of tolerance condition, the multivibrators will continuously apply suitable control signals to input terminals of the memory and microprocessor control logic gates. These logic gates are adapted to selectively apply respective control signals to each of the system memory and the microprocessor to inhibit reading or writing data from the memory and to keep the microprocessor central processing unit in a reset mode, whereby the execution of bookkeeping or accounting instructions is delayed until the power has stabilized to an acceptable or an in tolerance level.

DESCRIPTION OF THE PREFERRED EMBODIMENT

Figure 1:
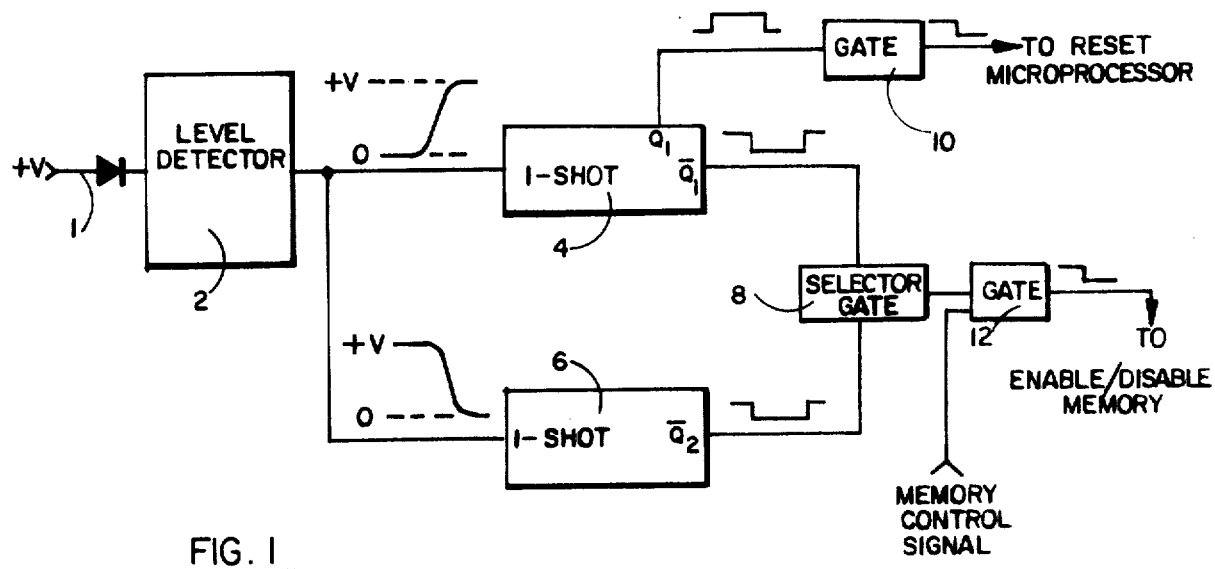
FIG. 1 is a block diagram which is representative of the protection circuit of the present invention.

Referring to FIG. 1 of the drawings, a block diagram is illustrated which is representative of the protection circuit of the present invention for preventing a loss or change in the contents of an electronic memory circuit, as a result of undesirable line transients or power interruptions. By way of example, the protection circuit disclosed herein has particular application in a system having a memory (e.g. a volatile CMOS RAM) that is utilized in a microprocessor controlled electronic pin ball game, wherein the critical accounting data relating to coin revenue, bookkeeping and credit information etc. is stored and maintained. Any loss or change of the accounting data stored in the electronic memory could result in serious loss of financial records and profits to the pin ball game operator. Although the instant protection circuit has particular utility for the memory of an electronic pin ball game, it is to be understood, however, that this is not to be regarded as limitative of the present invention. The presently disclosed protection circuit may be employed in any system (e.g. such as an electronic cash register, and the like) having a volatile memory and an auxiliary battery back up arrangement to maintain memory data integrity during power interruptions.

For normal operation of the electronic pin ball game, or similar apparatus, the electronic memory is regularly accessed by a central processing unit of the microprocessor, and the critical accounting data is stored or retrieved as needed, under the control of the system program. During an interval of power transistion, an output terminal 1 of a suitable power supply (not shown) applies a positive voltage signal +V to a threshold voltage level detector 2. Any out of tolerance (i.e., any voltage deviation from an acceptable operating power level) is sensed by the level detector 2. An output terminal of the level detector 2 is connected to respective input terminals of a pair of conventional one-shot monostable multivibrators 4 and 6. The one-shot multivibrator 4 is responsive to power coming up transitions, while the one-shot multivibrator 6 is responsive to power going down transistions. In a preferred embodiment, multivibrators 4 and 6 are retriggerable one-shots that are responsive to power up and power down conditions. The retriggerable characteristic is desirable in order to prevent loss of memory data during momentary perturbations occurring in the power line input signal. During these perturbations, the output of the level detector switches between signal levels that are indicative of in tolerance (i.e., acceptable) and out of tolerance (i.e., unacceptable) line conditions. The resulting output wave forms from the level detector 2 continuously retrigger both the power up and power down multivibrators 4 and 6 until the perturbations have ceased to exist and the power line input signal is stabilized at an acceptable level.

More particularly, in a power coming up condition, whenever the level detector 2 senses that the power supply is not yet at full operating voltage, a corresponding signal having a positive going transition is applied from the output of the level detector 2 to the input of the power up one-shot multivibrator 4. The positive transition signal triggers the power up one-shot multivibrator 4, whereby a relatively LOW logic level output signal $\overline{Q}_1$, one of two available complimentary signals, is generated by the multivibrator 4. This relatively LOW logic level output signal $\overline{Q}_1$, is applied to one input terminal of a selector gate 8. A relatively HI logic level output signal $Q_1$, the second of the two complimentary output signals generated by the one-shot multivibrator 4, is applied to an input terminal of a microprocessor control gate 10. A suitable output signal from the control gate 10 is applied to the system microprocessor to hold the microprocessor in a reset condition during the time that power line interruptions occur.

Alternatively, in a power coming down condition, whenever the level detector 2 senses that the input signal is undesirably diminished from an acceptable voltage level, a corresponding signal having a negative going transition is applied from the output of the level detector 2 to the input of the power down one-shot multivibrator 6. The negative transition signal triggers the power down multivibrator 6, whereby a relatively LOW logic level output signal $\overline{Q}_2$, one of two available complimentary signals, is generated by the multivibrator 6. This relatively LOW logic level output signal $\overline{Q}_2$ is applied to a second input terminal of the selector gate 8.

Thus, during an interval in which the power supply is out of tolerance, such that a power going up or power coming down condition exists, a relatively LOW logic level output signal is continuously applied to an input terminal of the selector gate 8 from one of the one-shot multivibrators 4 or 6. An output terminal of the selector gate 8 is connected to an input terminal of a memory control gate 12. Memory control gate 12 selectively enables the read and write logic of the memory for which data protection is provided. The selector gate 8 supplies a relatively LOW logic level output signal to the input terminal of the memory control gate 12, whenever a relatively LOW logic level input signal is applied to the selection gate 8 from either one of the one-shot multivibrators 4 or 6. Control gate 12 is adapted to supply a suitable disable signal to the electronic memory to inhibit the reading or writing operation thereof for the interval comprising the multivibrator output pulse width. Typically, the pulse width of the complimentary logic level output signals generated by multivibrators 4 and 6 is equivalent to a time that lies in a range of between 90-140 ms. In effect, the inhibiting signals supplied from the output terminals of the microprocessor control gate 10 and the memory control gate 12 impose a time delay before the microprocessor can execute instructions to enable the memory to commence bookkeeping or other accounting operations. Therefore, the normal memory operation can continue only after the power has stabilized at an acceptable or in tolerance operating voltage level and the last multivibrator has timed out.

Figure 2:
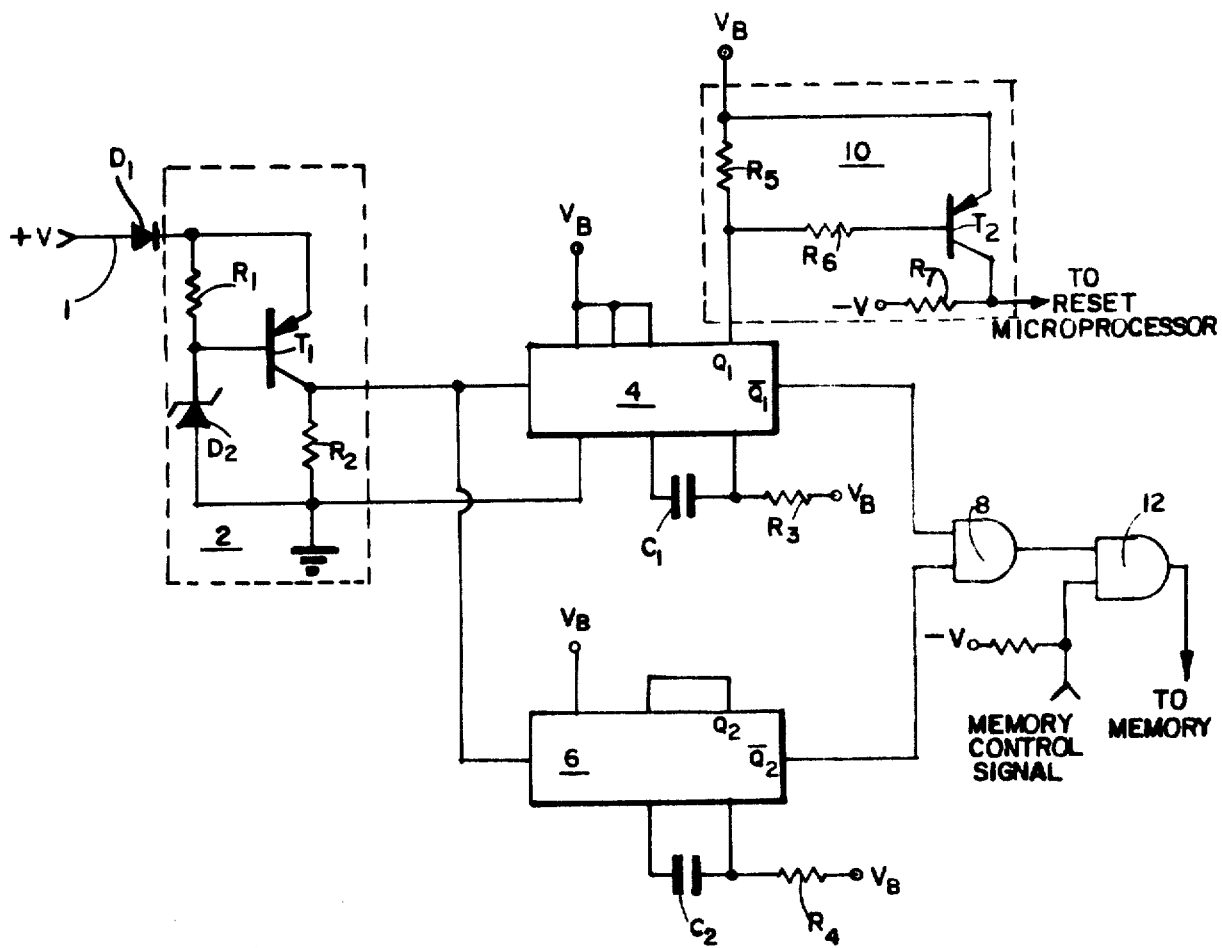
FIG. 2 is a schematic of the protection circuit of the present invention that is represented by the block diagram of FIG. 1.

FIG. 2 is a schematic of the protection circuit of the present invention, as represented by the block diagram of FIG. 1. The voltage threshold level detector 2 is comprised of diodes $D_1$ and $D_2$, resistors $R_1$ and $R_2$, and a pnp transistor device $T_1$. A detailed discussion of the level detector 2 will not be presented. Briefly, however, the emitter electrode of transistor $T_1$ is connected to an electrical junction with one terminal of resistor $R_1$ and the cathode electrode of diode $D_1$. The control electrode of transistor $T_1$ is connected at an electrical junction with the second terminal of resistor $R_1$ and the cathode electrode of a zener diode $D_2$. The collector electrode of transistor $T_1$ is connected at an electrical junction with one terminal of resistor $R_2$ and the output terminal of level detector 2. In operation, diode $D_1$ samples the input signal from the power supply and provides a reference voltage for signal level detection. When there are no power line interruptions, so that the power supply is in tolerance with acceptable conditions, the control electrode of transistor $T_1$ receives a positive voltage signal from the output terminal 1 of the power supply via diode $D_1$ and resistor $R_1$. Transistor $T_1$ is, thereby, rendered conductive. Thus, a positive going voltage edge is applied to the respective input terminals of each of the one-shot multivibrators 4 and 6 at the output terminal of level detector 2 via the collector electrode of transistor $T_1$. The pulse duration of the power up multivibrator 4 is determined by a RC circuit comprising a resistor $R_3$ connected in electrical series with a capacitor $C_1$ between a supply of relatively positive (battery) reference voltage $V_B$ and the multivibrator 4. The pulse duration of the power down multivibrator 6 is determined by an RC circuit comprising a resistor $R_4$ connected in electrical series with a capacitor $C_2$ between the supply of battery reference voltage $V_B$ and the multivibrator 6. In a preferred embodiment of the invention, one-shot multivibrators 4 and 6 are battery powered CMOS devices.

The selector gate 8 and the memory control gate 12 are each comprised of conventional 2-input positive logic AND gates. The output terminals of the power up and power down multivibrators 4 and 6 are respectively connected to one of the input terminals of the selector gate 8. The output terminal of the selector gate 8 is connected to one input terminal of the memory control gate 12. The second input terminal of the memory control gate 12 is connected to receive an external memory control signal to selectively enable the reading or writing of data into the memory. Whenever the power source provides an acceptable operating voltage level, relatively HI logic level signals $\overline{Q}_1$ and $\overline{Q}_2$ are respectively applied from output terminals of the power up and power down multivibrators 4 and 6 to the input terminals of the selector gate 8. Therefore, a relatively HI logic level signal is applied from the output terminal of selector AND gate 8 to an input terminal of the memory control AND gate 12. The memory control gate 12 is, thus, adapted to enable the memory to read or write data, as requested by the system program.

However, when power is coming up to or going down from the acceptable level, a relatively LOW logic level signal $\overline{Q}_1$ or $\overline{Q}_2$ is applied from an output terminal of either the power up or power down multivibrators 4 and 6 to one of the input terminals of the selector gate 8, as previously disclosed when referring to FIG. 1. Hence, a relatively LOW logic level signal is applied from the output terminal of selector AND gate 8 to one of the input terminals of the memory control gate 12. Therefore, the memory control AND gate 12 is disabled during an out of tolerance power line condition, whereby a relatively LOW logic level signal is provided at the output terminal of the memory control gate 12 to inhibit the reading or writing of data into the memory.

During the time interval that memory control gate 12 inhibits the memory from reading or writing data (i.e., during an interval in which an out of tolerance power line condition exists), a relatively HI logic level signal $Q_1$ is applied from an output terminal of the power up multivibrator 4 to the microprocessor control gate 10. The microprocessor control gate 10 is comprised of resistors $R_5$, $R_6$, and $R_7$ and a pnp transistor $T_2$. Since the microprocessor control gate 10 is of conventional design, a detailed description thereof is not presented. Briefly, however, the emitter electrode of transistor $T_2$ is connected at an electrical junction with one terminal of resistor $R_5$ and the source of battery reference voltage $V_B$. The control electrode of transistor $T_2$ is connected to an electrical junction with the second terminal of resistor $R_5$ and an output terminal of the power up multivibrator 4 so as to receive the $Q_1$ output signal therefrom. The collector electrode of transistor $T_2$ is connected to an electrical junction with one terminal of resistor $R_7$ and the output terminal of the microprocessor control gate 10. The second terminal of resistor $R_7$ is connected to a supply of relatively negative reference voltage $-V$. When the logic level of the signal $Q_1$ from an output terminal of power up multivibrator 4 goes relatively HI, transistor $T_2$ is rendered non-conductive. Therefore, the output terminal of the microprocessor control gate 10 is clamped to the $-V$ reference supply via resistor $R_7$ for the pulse width duration of multivibrator 4. The output terminal of the microprocessor control gate 10 is adapted to supply a suitable signal to maintain the central processing unit of the system microprocessor in a reset mode, whereby program execution is inhibited until power has stabilized at an acceptable operating voltage level. Therefore, the contents of the system memory is preserved without an undesirable loss or change of data, as a result of line transients or other power interruptions.

It will be apparent that while a preferred embodiment of the invention has been shown and described, various modifications and changes may be made without departing from the true spirit and scope of the invention.

Having thus set forth a preferred embodiment of the present invention, what is claimed is:

1. In a system including an electronic memory and a microprocessor to control the reading or writing of data into said memory, a protection circuit to prevent the loss or alteration of memory data as a result of power line interruptions, said protection circuit comprising:

power level detecting means having input and output terminal means, said level detecting means sampling the line power at said input terminal means thereof, first and second multivibrator devices connected to said output terminal means of said level detecting means, said first multivibrator device responsive to increasing power levels and said second multivibrator device responsive to decreasing power levels, and microprocessor and memory control gates connected to said first and second multivibrator devices in order to receive output signals therefrom that are indicative of either an out of tolerance power line interruption or in tolerance power line stabilization, said microprocessor and memory control gates adapted to selectively apply respective control signals to said microprocessor and to said memory to, thereby, inhibit the reading or writing of data into said memory and to maintain said microprocessor in a reset mode of operation during the occurrence of undesirable power line interruptions.

2. A protection circuit to disable each of an electronic memory and an associated microprocessor control circuit during an interval of input line disturbances, said protection circuit including:

power line detection means connected to an input power line to sense input line disturbances, first and second monostable means connected to output terminal means of said power level detection means to receive signals therefrom, said first monostable means responsive to input power coming up line disturbances and said second monostable means responsive to input power going down line disturbances, and control gating means respectively connected between said first and second monostable means and said electronic memory and microprocessor control circuit, said control gating means receiving signals from said first and second monostable means that are indicative of either a power coming up or power going down disturbance, whereby said control gating means applies control signals to inhibit the reading and writing of said memory and to delay the operation of said microprocessor control circuit during the occurrence of the power line disturbances.

3. The protection circuit recited in claim 2, wherein each of said first and second monostable means comprises a one-shot multivibrator.

4. The protection circuit recited in claim 3, wherein each of said one-shot multivibrators is a retriggerable, battery powered device.

5. The protection circuit recited in claim 2, wherein said control gating means comprises first and second logic gates, said first logic gate having input terminal means connected to respective first output terminals of each of said first and second monostable means and output terminal means connected to said electronic memory, and said second logic gate having input terminal means connected to a second output terminal of said first monostable means and output terminal means connected to said microprocessor control circuit.

6. The protection circuit recited in claim 5, wherein said first logic gate receives input signals having a first polarity from the first output terminals of said first and second monostable means to inhibit the reading or writing of said electronic memory, and said second logic gate receives input signals having a second polarity from the second output terminal of said second monostable means to delay the operation of said microprocessor control circuit during the occurrences of power line disturbances.

7. The protection circuit recited in claim 2, wherein said power level detection means comprises a multi-terminal semiconductor device, a first conduction path terminal thereof connected to said input power line, a second conduction path terminal thereof connected to said level detection output terminal means, and a control terminal thereof connected to one electrode of a diode means to regulate the conductivity of said semiconductor device.

* * * * *